United States Patent
Yahav et al.

(10) Patent No.: US 12,111,344 B2
(45) Date of Patent: Oct. 8, 2024

(54) METHOD AND SYSTEM FOR DYNAMIC SHORT CIRCUIT CALCULATION

(71) Applicant: ELECTRICAL GRID MONITORING LTD., Rosh Haayan (IL)

(72) Inventors: Yaakov Yahav, Netanya (IL); Nimrod Sandlerman, Ramat Gan (IL)

(73) Assignee: ELECTRICAL GRID MONITORING LTD., Rosh Haayin (IL)

( * ) Notice: Subject to any disclaimer, the term of this patent is extended or adjusted under 35 U.S.C. 154(b) by 0 days.

(21) Appl. No.: 18/419,589

(22) Filed: Jan. 23, 2024

(65) Prior Publication Data

US 2024/0248127 A1     Jul. 25, 2024

Related U.S. Application Data

(60) Provisional application No. 63/440,445, filed on Jan. 23, 2023.

(51) Int. Cl.
*G01R 31/08*     (2020.01)
*G01R 31/52*     (2020.01)

(52) U.S. Cl.
CPC ........... *G01R 31/086* (2013.01); *G01R 31/52* (2020.01)

(58) Field of Classification Search
None
See application file for complete search history.

(56) References Cited

U.S. PATENT DOCUMENTS

| | | | | |
|---|---|---|---|---|
| 8,513,952 B2 * | 8/2013 | Barkan | ................... | H04L 43/50 |
| | | | | 324/528 |
| 11,064,272 B2 * | 7/2021 | Miron | ................... | H04L 12/403 |

* cited by examiner

*Primary Examiner* — Farhana A Hoque
(74) *Attorney, Agent, or Firm* — AlphaPatent Associates Ltd.; Daniel J. Swirsky (57) ABSTRACT

A method, and a system and/or computer program implementing the method, for predicting short circuit events in an electric grid, the method including: distributing a plurality of cable mounted sensors on each phase carrying cable of the electric grid, measuring one or more instantaneous voltage and instantaneous current by each of the plurality of cable mounted sensors, determining electricity generation sources feeding the electric grid, determining voltage output for each electricity generation source feeding the electric grid, and determining cable length from each electricity generation source where short-circuit current may be higher than permitted short circuit current.

18 Claims, 6 Drawing Sheets

METHOD AND SYSTEM FOR DYNAMIC SHORT CIRCUIT CALCULATION

FIELD

The method and apparatus disclosed herein are related to the field of electric grid, and, more particularly but not exclusively, to the management of electric distribution networks, and, more particularly but not exclusively, to estimating the severity probability of short circuit events in various locations of the grid.

BACKGROUND

Equipment installed in distribution grids, such as: insulators, wires, connectors, transformers, switches, etc., is designed to withstand a particular short-circuit current that may develop in the grid as defined by its manufacturers. The short circuit path in the distribution grid is a 'closed-path' going from the power transformer to the location of the fault and returns to the transformer either through the transformer's 'zero point' or through another phase (or two).

While the main equipment in the substations, such as circuit breakers, is designed to withstand high short-circuit currents (over 25 KA), the equipment installed along the grid is designed to withstand much lower short-circuit currents. For example: in a 22 KV grid it is acceptable that the equipment installed should withstand in a 12.5 KA short current, while the equipment installed in a 33 KV grid should withstand in 8 KA short current.

The actual magnitude of the current in short is determined by the grounding configuration of the transformer (direct grounding, grounding through a resistor or through a Patterson coil, etc.), the line impedance, the transformer internal parameters etc. In normal working regimes, the short currents that develop in the grid are lower than the planned threshold. However, in other regimes, such as when two transformers are connected in parallel, a short-circuit current may be twice the planned threshold, or even more.

Additional distributed generation resources, such as gas turbine generators at large electricity consumers), which connect to the distribution grid, may increase the short-circuit current. And even further when connecting two power transformers at the same time, as well as an additional generation source. The even higher short-circuit current may cause damage to the equipment installed in the grid and/or to the customer's facilities.

In order to limit short currents in distribution grids, several technologies, mainly fault current limiters (FCL) and reactors, are used, such as current limiters installed in substations or distributed generation sites. The disadvantages of these technologies are their high price, the need for additional space to install these devices, as well as many operational constraints. Due to the aforementioned disadvantages, and mainly due to operational constraints, the use of such technologies is quite limited. It would therefore be highly advantageous to have a method and a system, devoid of the above limitations, for estimating the severity probability of short circuit events.

SUMMARY

According to one exemplary embodiment of the invention there is provided a method, and a system and/or computer program implementing the method, for predicting short circuit events in an electric grid, the method including: distributing a plurality of cable mounted sensors on each phase carrying cable of the electric grid, measuring one or more instantaneous voltage and instantaneous current by each of the plurality of cable mounted sensors, determining electricity generation sources feeding the electric grid, determining voltage output for each electricity generation source feeding the electric grid, and determining cable length from each electricity generation source where short-circuit current may be higher than permitted short circuit current.

According to another exemplary embodiment the method additionally provides a user visual information of the cable length subject to excessive short-circuit current.

According to yet another exemplary embodiment the visual information provided to the user includes a geographical map of the electric grid, and/or a topological map of the electric grid.

According to still another exemplary embodiment the method additionally includes calculating probability of an excessive short circuit event.

Further, according to another exemplary embodiment the method additionally includes calculating the probability of excessive short circuit events according to ratio between total length of cable where short-circuit current may be higher than permitted short circuit current and total length of grid cables.

Yet further according to another exemplary embodiment the method additionally includes receiving from a user a selection of a part of the electric grid, and calculating the probability of an excessive short circuit event within the selected part of the electric grid.

Still further according to still another exemplary embodiment the method additionally includes measuring, by one or more the cable mounted sensors, one or more of temperature, humidity, wind speed and direction, precipitation rate and type, cable temperature, and temperature of at least one of the electricity generation sources, and determining the cable length from each electricity generation source where short-circuit current may be higher than permitted short circuit current according to the at least one temperature measurements.

Unless otherwise defined, all technical and scientific terms used herein have the same meaning as commonly understood by one of ordinary skill in the relevant art. The materials, methods, and examples provided herein are illustrative only and not intended to be limiting. Except to the extent necessary or inherent in the processes themselves, no particular order of steps or stages of methods and processes described in this disclosure, including the figures, is intended or implied. In many cases the order of process steps may vary without changing the purpose or effect of the methods described.

BRIEF DESCRIPTION OF THE DRAWINGS

Various embodiments of the invention are described herein, by way of example only, with reference to the accompanying drawings. With specific reference now to the drawings in detail, it is stressed that the particulars shown are by way of example and for purposes of illustrative discussion of the embodiments only, and are presented in order to provide what is believed to be the most useful and readily understood description of the principles and conceptual aspects of the embodiments.

In this regard, no attempt is made to show structural details of the embodiments in more detail than is necessary for a fundamental understanding of the invention, the description taken with the drawings making apparent to those skilled in the art how the several forms and structures may be embodied in practice.

In the drawings.

DETAILED DESCRIPTION

The invention, in embodiments thereof, provides a system, a method, and/or a computer program for estimating the location, probability, and severity of short circuit events. The principles and operation of the system, the method, and/or the computer program, according to the several exemplary embodiments, may be better understood with reference to the following drawings and accompanying description.

Before explaining at least one embodiment in detail, it is to be understood that the embodiments are not limited in their respective applications to the details of construction and the arrangement of the components set forth in the following description or illustrated in the drawings. Other embodiments may be practiced or carried out in various ways. Also, it is to be understood that the phraseology and terminology employed herein is for the purpose of description and should not be regarded as limiting.

In this document, an element of a drawing that is not described within the scope of the drawing and is labeled with a numeral that has been described in a previous drawing has the same use and description as in the previous drawings. Similarly, an element that is identified in the text by a numeral that does not appear in the drawing described by the text, has the same use and description as in the previous drawings where it was described.

The drawings in this document are not meant to be on any scale. Different FIGS. may use different scales and different scales can be used even within the same drawing. For example, different scales for different views of the same object or different scales for two adjacent objects.

The phrases "at least one" "one or more" and "and/or" are open-ended expressions that are both conjunctive and disjunctive in operation. For example, each of the expressions "at least one of A, B and C, "at least one of A, B, or C, "one or more of A, B, and C. "one or more of A, B, or C and "A, B, and/or C' means A alone, B alone, C alone, A and B together, A and C together, B and C together, or A, B and C together. The terms "a" or "an entity" refers to one or more of that entity. As such, the terms "a" (or "an"), "one or more" and "at least one' can be used interchangeably herein.

It is also to be noted that the terms 'comprising', 'including', 'containing', 'characterized by', and 'having' are all inclusive, open-ended, does not exclude additional, unrecited elements or method steps, and can be used interchangeably. Particularly, these terms may imply the inclusion of a stated integer or step or group of integers or steps but not the exclusion of any other integer or step or group of integers or steps. This definition also applies to variations on the term "comprising" such as "comprise" and "comprises".

Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment", and similar language throughout this specification may, but do not necessarily, all refer to the same embodiment.

The term plurality, as used herein, is defined as two or more than two. The term another, as used herein, is defined as at least a second or more. The term coupled, as used herein, is defined as connected, although not necessarily directly, and not necessarily mechanically.

In this document, the term 'computing device' may refer to any type of computing machine, including but not limited to, a computer, a portable computer, a laptop computer, a tablet computer, a mobile communication device, a network server, a cloud computer, etc., as well as any combination thereof. Such computing device or computing machine may include any type or combination of devices, including, but not limited to, a processor or a processing device, a memory device, a storage device, a user interface device, and/or a communication device.

The terms 'execute', 'perform', 'compute', 'calculate', etc. may refer to a processor of a computational device executing a software program code embodied on a non-transitory computer readable medium to achieve a result such as described after any of the terms 'execute', 'perform', compute, calculate, etc.

The term 'client computing device', or 'client device', 'user device' may refer to any type of computing device that is directly used, or operated, by a user. Such device may include a user interface that may be used by a user directly, including means for user input and/or user output. Such device may be communicatively coupled to another computing devices such as a network server via a communication network.

Means for user input may include a keyboard, a pointing devices such as a mouse, a microphone, a camera, a touch-sensitive plate or display, means for user gesture control, means for haptic user control, etc.

Means for user output may include a display, and/or any other means for providing visual information, a speaker, or an earphone, and/or any other means for providing audible information, means for providing tactile and/or haptic information, etc.

The term 'mobile communication device' may refer to devices such as a tablet, a mobile telephone, a smartphone, etc.

The term 'network server' or 'server' may refer to any type of 'computing device' that is communicatively coupled to a communication network and may include a cloud computer, etc.

The term 'communication network' or 'network' may refer to any type or technology for digital communication including, but not limited to, the Internet, WAN, LAN, MAN, PSDN, etc. Any of the abovementioned technologies may be wired or wireless, for example, Wireless WAN such as WiMAX, WLAN (Wi-Fi), WPAN (Bluetooth), etc. Wireless networking technology may also include PLMN, and/or any type of cellular network. The term 'communication network' or 'network' may refer to any combination of communication technologies, and to any combination of physical networks. The term 'communication network' or 'network' may refer to any number of interconnected communication networks that may be operated by one or many network operators.

The term 'application' may refer to a software program running on, or executed by, one or more processors of a computing device, and particularly by a mobile computing device such as a mobile telephone, a tablet, a smartphone, etc., as well as any other mobile or portable computing facility. The term 'mobile application' may refer to an application executed by a mobile computing device.

In this document the terms 'electric transmission network', 'electrical transmission network', 'electricity transmission network', 'electric power transmission', 'power line', 'power transmission' and 'power grid' can be used interchangeably and relate to either or both underground and overhead transmission. The terms 'grid', or 'electric grid', or 'electric network' may refer to the electric transmission network and/or the electric distribution network, and to any part of such network between the power generating station, or stations, and the load, or the consumer(s).

The term 'cable', or 'electric cable', may refer to any single cable, or wire, or powerline, of the grid, such as a phase carrying cable. The term 'cable device', or 'measuring device', or 'sensor' may refer to any device mounted on an electric cable of a grid, including a sensor, a measuring device, a communication device, etc. As a non-limiting example, the cable device may derive power from the electric field and/or magnetic field around the electric cable, where the electric and/or magnetic field may be generated by the electric current flowing in the electric cable.

The term 'measurement' or 'electrical measurement' may refer to any type of measurement of any electric parameter such as voltage, current, electric field, magnetic field, resistance, capacitance, inductance, electric charge, etc. The term 'physical measurement' or 'mechanical measurement' may refer to any type of measurement of any physical parameter other than electrical parameters. Such parameters may be temperature, wind (including speed and/or direction), humidity, motion, height, (cable) depression, (cable) angle, etc. Such measurements are typically performed by a cable device mounted on an electric cable.

The system of measuring devices may measure various electric parameters in a plurality of locations in an electric cable, or an electric network, or an electric grid, and determine, by comparing a plurality of measurements, the type and location of a particular parameter, and/or phenomenon, and/or fault. Such measurement may be taken at a point of the electric cable which may be in mid cable, which is at a distance from any pole or insulator supporting the cable. In such a point, the measuring device may not have any electric contact with a reference point such as ground, or zero or neutral, or common line, etc.

In this respect, the voltage measuring device may be electrically coupled to the electric cable as a first reference point for measuring potential difference (e.g., voltage), but may lack a second electric contact to a second reference point (namely, neutral, ground, common line, etc.)

The term 'mid cable' may refer to any position or point along the electric cable in which the cable device, or sensor, or measuring device, may be mounted on the electric cable, and where the cable device, or sensor, or measuring device, may not have access or electric contact to a reference electric potential such as ground, zero line, common like, neutral line, etc.

The term 'reference point' may refer to any such reference electric potential such as ground, zero line, common like, neutral line, a powerline of a different phase, a reference plane, etc.

The term 'electrically coupled', or 'electrically connected', or simply 'connected' may refer to direct (e.g., galvanic contact) or indirect electric contact.

The term 'ungrounded voltage measurement' may refer to measuring electric voltage, or electric potential, of an electric element, such as an electric cable, being a first electric reference point, without contacting a second electric reference point, such as reference point, zero voltage line, common line, neutral line, a power line of a different phase, etc. For simplicity, all such versions of the second electric reference point may be referred herein as 'reference point'.

The terms 'intermittent' or 'instantaneous' may refer to any electric phenomenon that is short, typically below one second. In this respect, 'intermittent phenomenon' may refer to any type of short-time or instantaneous change of voltage and/or current and/or power. Such 'intermittent phenomenon' may take the form of a surge (positive, or negative, or both), a pulse (positive, or negative, or both), a transient, a spike, etc.

The term 'absolute time' may refer to the time-of-day or a length of time measured from a common universal time. Absolute time may be provided via a signal from an external accurate clock such as a GPS (global positioning system) signal. The terms 'time of flight' or 'time of travel' may refer to the time it takes for a signal to travel from a first point to a second point, such as from a point of origin of the signal to a point of detection, or measurement.

The device measuring the electric signal may be an electric sensor operative to measure one or more electric parameters such as electric voltage and/or electric current. The measuring device may be mounted on the electric cable, anywhere over the electric cable, whether on or near a pole carrying the cable, or anywhere between two poles or between two insulators carrying or supporting the cable. The cable may be an overhead cable or an underground cable. For example, for an underground cable the measuring device may be placed in a location where the underground cable is exposed, and/or with no shield, such as in maintenance holes (manholes) or split points, etc.

The term 'short-circuit' may refer to a connection between a phase carrying cable and a neutral cable or ground so that a short-circuit path is formed in the distribution grid. This short-circuit path is a 'closed-path' going from the power transformer feeding the grid, to the location of the short-circuit, and returns to the transformer through the transformer's "zero point". The term 'short-circuit' may refer to the electric current through the phase carrying cable.

The term 'energy source', 'energy resource', 'electricity source', 'electricity generation system', etc., may refer to any source of electricity feeding the grid. For example, a transformer, a gas turbine, a wind turbine, a photo-voltaic system, an energy storage system, etc.

Figure 1:
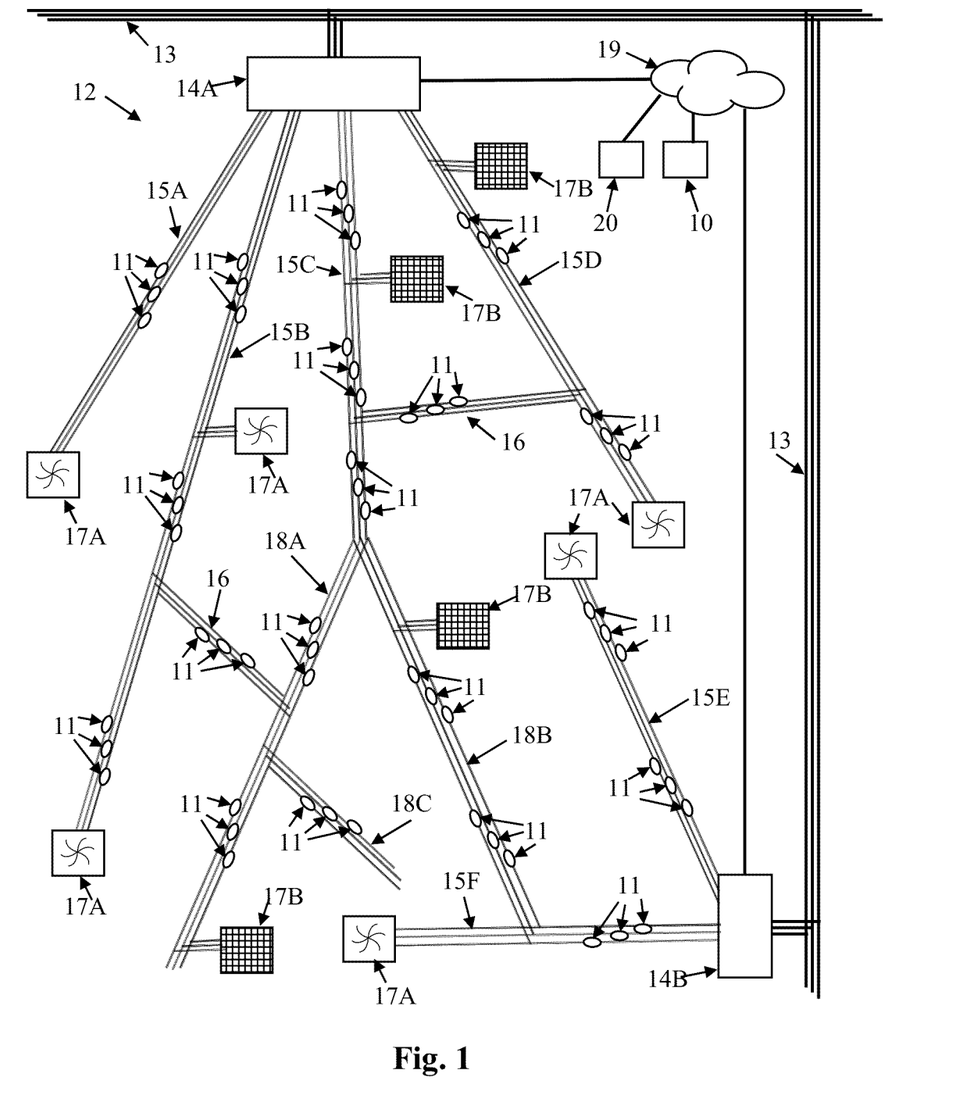
FIG. 1 is a simplified illustration of a short-circuit analysis system communicatively coupled to a plurality of cable devices mounted on a distribution grid connected to a transmission grid via two transformer stations.

Reference is now made to FIG. 1, which is a simplified illustration of a short-circuit analysis system 10 communicatively coupled to a plurality of cable devices 11 mounted on a distribution grid 12 connected to a transmission grid 13 via two transformer stations 14 (enumerated 14A and 14B), according to one exemplary embodiment.

As shown in FIG. 1, The distribution grid 12 may include six feed lines 15, however, any number of feed lines is contemplated. The six feed lines are enumerated as 15A, 15B, 15C, 15D, 15E, and 15F. Two tie lines 16 may be connected between feed lines 15B—15C and between 15C-15D, though any number and configuration of tie lines is contemplated. Feed lines 15A, 15B, 15C, and 15D are connected to transformer station 14A, and feed lines 15E and 15F are connected to transformer station 14B. Feed lines 15C and 15F are interconnected via sub-line 18B, thus connecting between transformer station 14A and transformer station 14B.

As shown in FIG. 1, one or more electricity generation systems 17 may be connected to any one of feed lines 15. Such as turbines 17A (gas turbines, wind turbines, etc.) and photovoltaic systems 17B. Other types of electricity generation systems are contemplated as well as energy storage systems.

A plurality of consumer systems (not shown in FIG. 1) may be distributed along feed lines 15. A plurality of cable devices 11 may be mounted over any of the power lines of distribution grid 12. It is appreciated that any number of cable devices 11 may be mounted anywhere over any of the power lines (phases) of distribution grid 12. Some cable devices 11 may be mounted close to respective transformer stations 14 and/or electricity generation systems 17.

As shown in FIG. 1, feed line 15A is split into two sub-lines 18A and 18B. It is appreciated that any feed line 15A may be split into any number of sublines in various forms and split levels (e.g., 18C). The term 'local grid' may refer to the entire grid 12 or to a distinct part of grid 12 such as a particular feed line 15, or a sub-line 18. The entire structure and/or topology of distribution grid 12 of FIG. 1 is provided as an example only.

Communication network 19 may represent any number of communication networks of any type including wireline and wireless networks. Communication network 19 may also represent several networks that are not inter-connected, where each network serves a different pair or group of computational devices capable of communicating.

For example, communication network 19 may interconnect between transformer station 14 and grid management system 20, between grid management system 20 and short-circuit analysis system 10, between short-circuit analysis system 10 and energy generation systems 17, etc. Cable devices 11 may use communication network 19 to communicate between themselves and with short-circuit analysis system 10.

Mounting cable devices 11 at the beginning of the line near transformer station(s) 14, as well as at parallel points in the grid, as well as at the connection point of distributed generators 17 to the distribution grid 12, enables short-circuit analysis system 10 to perform a dynamic calculation of a short-circuit current at any point in the grid, according to the grid configuration.

Therefore, short-circuit analysis system 10 may analyze possible short-circuit currents at different points in the grid, and providing a warning about situations in which the developed maximum short-circuit current may be higher than the maximum value (of the short-circuit current) set by the user (for example 8 KA).

When short-circuit analysis system 10 detects a parallelism between two transformers, and at the same time another generator is connected to the grid, it will be able to calculate the maximum short-circuit current that can develop in the line, according to the actual grid data. The short-circuit analysis system 10 may then warn a user of short-circuit analysis system 10, if this value (of maximum short-circuit current) may exceed the maximum allowed value.

Additionally, the short-circuit analysis system 10 may calculate the probability of the occurrence of excessive short circuit current events, exceeding the maximum set value for short-circuit currents. For example, the probability of occurrence of a short circuit current may be calculated by analyzing the minimum impedance of the grid that in case of a fault will not exceed the threshold that was set by the operator. Dividing the cumulative length of the feeders segments that are less than the minimum impedance by the total length of the feeder may provide a probability value of exceeding the short circuit current threshold.

According to the information provided by short-circuit analysis system 10 (regarding excessive short-circuit possibilities), an operator in a control room may be able to stop the additional production facility (the generator) or take other actions to limit the short-circuit current that may develop during a network failure. Using the short-circuit analysis system 10 may increase the ability to connect distributed electricity production resources to the distribution network while reducing the risk of excessive short-circuit currents.

Figures 2, 3:
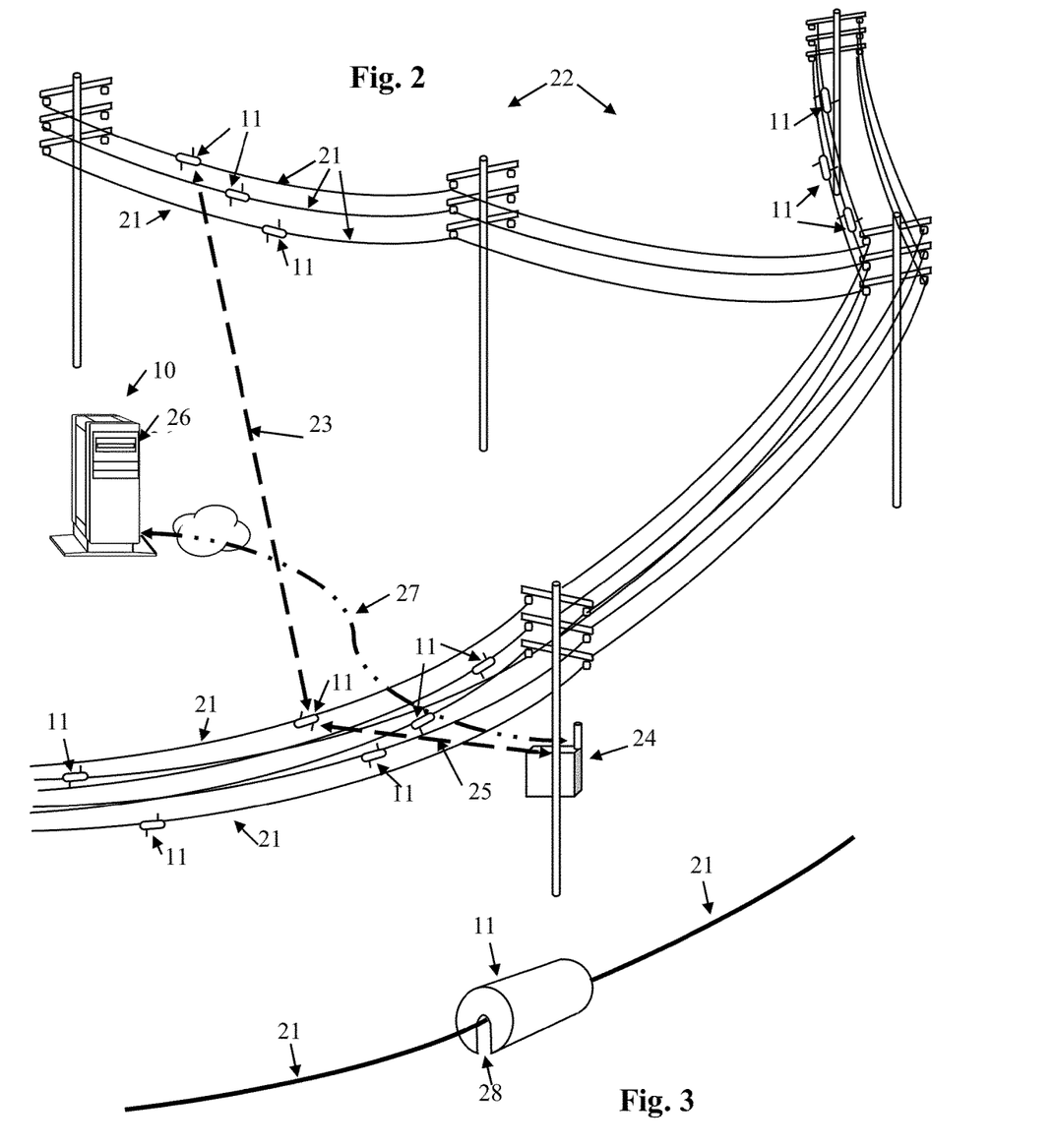
FIG. 2 is a simplified illustration of a short-circuit analysis system communicatively coupled to a plurality of cable devices mounted on respective electric cables of an electric grid.
FIG. 3 is a simplified illustration of cable device mounted on a cable and showing a slot for inserting the cable into the cable device.

Reference is now made to FIG. 2, which is a simplified illustration of a short-circuit analysis system 10 communicatively coupled to a plurality of cable devices 11 mounted on respective electric cables 21 of an electric grid 22, according to one exemplary embodiment.

As an option, the simplified illustration of FIG. 2 may be viewed in the context of the details of the previous Figures. Of course, however, the simplified illustration of FIG. 2 may be viewed in the context of any desired environment. Further, the aforementioned definitions may equally apply to the description below.

FIG. 2 shows a plurality of cable devices 11 mounted in various different places of electric grid 22. Particularly, cable devices 11 may be mounted on cables 21 of electric grid 22. A cable device 11 may be mounted on a cable 21 in mid cable, and is typically ungrounded. As shown in FIG. 2, cables 21 may be supported by poles, via insulators. FIG. 2 shows cables 21 between the poles or insulators. As shown in FIG. 2, a plurality of cable devices 11 may mounted in various different places of each of cables 21 of electric grid 22.

Alternatively, a cable device 11 may be mounted in a particular place of a cable 21 of electric grid 22 and also measure phenomenon on other, parallel, cable 21 of electric grid 22 in co-located places.

As shown in FIG. 2, cable devices 11 may be electrically coupled to their respective cables 21, but are not connected to any other reference point such as ground, zero voltage line, common line, neutral line, etc.

In this respect, cable devices 11 may derive their operation energy, or electric power, from their respective cables 21, particularly, from the electric field, and/or from the magnetic field surrounding the electric cable 21 and produced by the electric voltage carried by the electric cable 21, and/or the electric current carried by the electric cable 21 (as will be further explained below).

In this respect, cable devices 11 may measure the electric current flowing via the respective electric cable 21, and/or electric voltage carried by the respective electric cable 21, by measuring the magnetic field, and the electric field, respectively. In this respect the voltage measuring system is an ungrounded voltage measuring system. It is appreciated that cable devices 11 may measure other physical phenomena such as temperature, humidity, wind, wind direction, location (e.g., by a GPS receiver), cable depression and angle, cable motion, etc.

Cable devices 11 may communicate between themselves as shown by arrow 23, and/or with local controller 24 as shown by arrow 25, and/or with local server 26 as shown by arrow 27. For simplicity, as a non-limiting example, local server 26 serves here as short-circuit analysis system 10. However, local server 26 may further communicate with a remote server that may also serve as short-circuit analysis system 10. Therefore, there may be several short-circuit analysis systems 10, each serving a different part of the electric grid, where some parts may be overlapping.

Reference is now made to FIG. 3, which is a simplified illustration of cable device 11, mounted on cable 21 showing slot 28 for inserting cable 21 into cable device 11.

As an option, the simplified electric diagram of FIG. 3 may be viewed in the context of the details of the previous Figures. Of course, however, the simplified electric diagram of FIG. 3 may be viewed in the context of any desired environment. Further, the aforementioned definitions may equally apply to the description below.

Each of the cable devices 11 may include a slot 28 or a similar arrangement through which cable 21 may be inserted into cable devices 11 when mounting cable devices 11 on a live cable 21.

Figure 4:
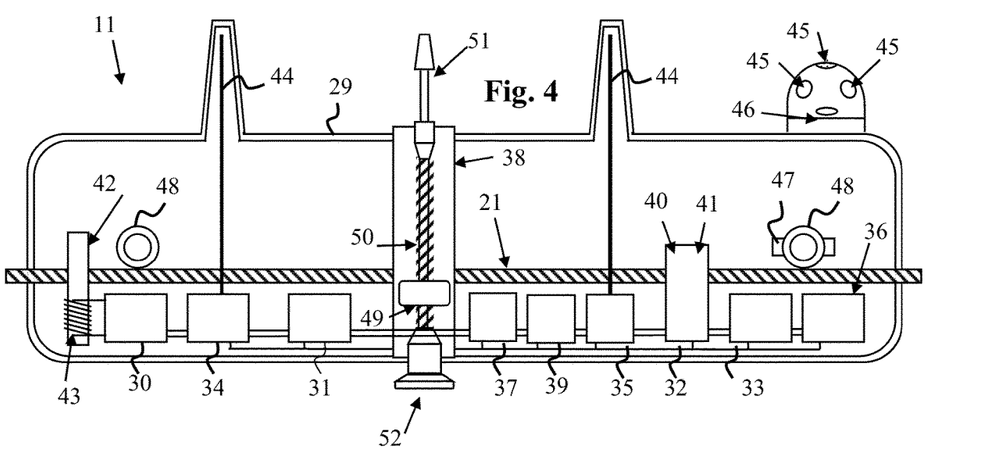
FIG. 4 is a simplified illustration of a cut through a cable device mounted on an electric cable.

Reference is now made to FIG. 4, which is a simplified illustration of a cut through cable device 11 mounted on an electric cable 21, according to one exemplary embodiment.

As an option, the illustration of cable device 11 of FIG. 4 may be viewed in the context of the details of the previous Figures. Of course, however, the illustration of cable device 11 of FIG. 4 may be viewed in the context of any desired environment. Further, the aforementioned definitions may equally apply to the description below.

As shown in FIG. 4, the cable device 11 may include a box, or a body 29, through which the electric cable 21 passes. The electric cable 21 may be a part of an electric grid, an electric transmission network, or an electric distribution network, such as maintained by a power utility to provide electricity to the public, to industrial plants, etc. The cable device 11 may therefore be mounted on a live cable 21. That is, when cable 21 is fully powered and/or carries electric voltage and/or electric current.

The box 29 may be constructed of two parts which may be opened, and then closed around the cable 21. Alternatively, box 29 may be constructed of one part surrounding most of the cable diameter and having an opening at one side, such as slot 28 (not shown in FIG. 4), to insert cable 21 and attach the box to cable 21. Other constructions and shapes of box 29 are contemplated.

As shown in FIG. 4, the cable device 11 may include a power supply module 30, a controller module 31, one or more electric measuring devices 32, one or more physical measuring devices 33, and a backhaul communication module 34. Optionally, the cable device 11 may also include a local area communication module 35, a remote sensing module 36, and a propulsion control module 37. Optionally, the cable device 11 may also include cable clamping part 38, and a GPS module 39.

The GPS module 39 may serve here as an accurate time source. The time source of the cable device 11 may be any type of time source providing accuracy of 50 nanoseconds or better. The GPS module 39 is expected to provide time accuracy of 10 nanoseconds or better. Optionally, GPS module 39 may also provide an accurate universal clock, for example, for accurately determining absolute time of measurement. In this regard, the GPS signal serves as an accurate common time for all the cable devices 11, so that all the clocks of all the cable devices 11 are synchronized to the accuracy of the GPS signal. Optionally, cable device 11 may also include a global positioning service (GPS) module 39 and may use it to measure, monitor, and/or control the position of the cable device 11 along electric cable 21.

Electric measuring devices 32 may include one or more voltage measuring devices 40 and/or current measuring devices 41.

As shown in FIG. 4, the cable device 11 may include a magnetic core 42 over which at least one coil is wrapped to form a winding 43. The magnetic core 42 may be mounted around the electric cable 21. The magnetic core 42 may be constructed from two parts, a part in each of the two parts of box 29 where the two parts of the magnetic core 42 are closed around electric cable 21 when box 29 is attached to electric cable 21. However, optionally, and particularly for a high voltage cable, magnetic core 42 may be open in the sense that it has a slot though which electric cable 21 may be inserted.

The magnetic core 42 typically derives magnetic field from the electric current flowing in the electric cable 21. Winding 43 may derive electric current from the magnetic flux in the magnetic core 42. Winding 43 may be electrically coupled to power supply module 30, typically providing electric voltage to other modules of cable device 42. It is appreciated that cable device 11 may derive electric power from a single electric cable 21.

Alternatively or optionally, cable device 11 may derive electric power from a single electric cable 21 from the electric field of a high-voltage grid, for example, even when the electric cable 21 dose not carry current.

Alternatively, for example when used with insulated high-voltage cables, and/or underground cables and/or low-voltage grids, power supply module 30 may be connected to sensors attached to electric cables deriving power supply from other sources such as a main unit connected to a low voltage output of a transformer, a battery, a photovoltaic (PV) element, etc. Such configuration of cable device 11 may have only one part with an opening at the bottom.

Backhaul communication module 34 and local area communication module 35 may be coupled, each and/or both, to one or more antennas 44. Remote sensing module 36 may be coupled to and control various sensors, one or more cameras 45, one or more microphones 46, etc. It is appreciated that a camera can be mounted on a system of axels providing three-dimensional rotation. Alternatively, a plurality, or an array, of fixed cameras can be mounted to cover a large field of view as needed.

At least one camera 45 may provide an image of at least a part of the sky. Controller module 31 may process the sky image to produce cloud parameters such as cloud position, cloud area, speed of motion of the cloud, and direction of motion of the cloud. Such cloud parameters may be computed for each cloud within the sky image. Cloud parameters may be communicated to grid analysis system 10, which may compute more accurate cloud parameters, including cloud height, based on triangulation of at least three cable devices 11, which GPS data is known.

Backhaul communication module 34 and local area communication module 35 may use any type of communication technology and/or communication network such as, but not limited to: The terms 'communication technology', or 'communication network', or simply 'network' refer to any type of communication medium, including but not limited to, a fixed (wire, cable) network, a wireless network, and/or a satellite network, a wide area network (WAN) fixed or wireless, including various types of cellular networks, a local area network (LAN) fixed or wireless including Wi-Fi, and a personal area network (PAN) fixes or wireless including Bluetooth, ZigBee, and NFC, power line carrier (PLC) communication technology, etc. The terms 'communication network', or 'network' may refer to any number of networks and any combination of networks and/or communication technologies.

Controller module 31 may include a processor unit, one or more memory units (e.g., random access memory (RAM), a non-volatile memory such as a Flash memory, etc.), one or more storage units (e.g. including a hard disk drive and/or a removable storage drive, etc.) as may be used to store and/or to execute a software program and associated data and to communicate with external devices.

Propulsion control module 37 may be coupled to one or more actuating devices such as electric motor 47, which may be coupled to one or more wheels 48. Wheels 48 may be mounted on cable 21 to enable propulsion control module 37 to move the cable device 11 along cable 21 by controlling the electric motor 47.

It is appreciated that the propulsion system of cable device 11 (including, but not limited to propulsion control module 37, one or more electric motors 47 one or more wheels 48 etc.) may be operative to move cable device 11 along cable 21 and/or to rotate cable device 11 around cable 21.

It is appreciated that electric motor 47 represents herein any type of technology adequate to maneuver cable device 11 along and/or around cable 21, including, but not limited to, an AC motor, a DC motor, a stepper motor, a pneumatic pump and/or motor, a hydraulic pump and/or motor, or any other type of actuator.

Grid analysis system 10 may use the propulsion system and the GPS system of cable device 11 to distribute and position the cable devices 11 within the area serviced by the local grid to provide irradiation measurements around the respective photovoltaic electric generation units 17. As cable devices 11 may be positioned to provide sunlight and shadow irradiation measurements, grid analysis system 10 may redistribute cable devices 11 according to the changing location of the clouds, the associated shadow map, and the direction of motion of the clouds and/or their respective shadows.

Cable clamping part 38 may include, for example, a cable holder part 49 that may be pressed to cable 21 to firmly attach cable device 11 to cable 21. Cable holder part 49 may be maneuvered (e.g., up and down) by electrical means and/or by mechanical means such as a threaded rod 50. Threaded rod 50 may be operated by an electric actuator, or, by a shaft 51 inserted into a socket of cable attachment actuator part. Alternatively, Threaded rod 50 may be operated by a rod inserted into socket 52.

Figure 5:
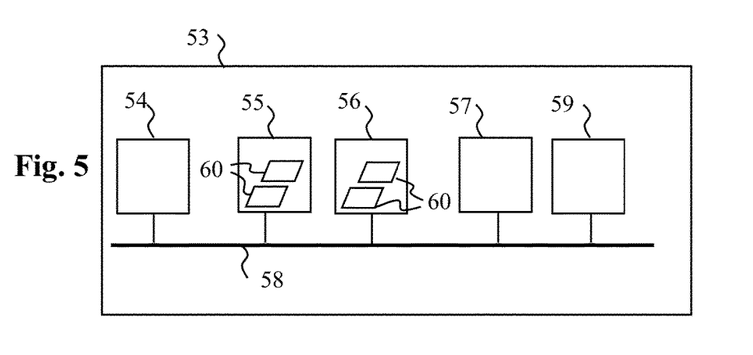
FIG. 5 is a simplified block diagram of a computational device that may be used by a cable device and/or a short-circuit analysis system.

Reference is now made to FIG. 5, which is a simplified block diagram of a computational device 53, according to one exemplary embodiment.

As an option, the block diagram of FIG. 5 may be viewed in the context of the details of the previous Figures. Of course, however, the block diagram of FIG. 5 may be viewed in the context of any desired environment. Further, the aforementioned definitions may equally apply to the description below. Particularly, the computational device 53 of FIG. 5, may correspond to, or may be included within, for example, cable device 11, local controller 24, server 26, grid management system 20, grid analysis system 10, etc.

As shown in FIG. 5, computational device 53 may include at least one processor unit 54, one or more memory units 55 (e.g., random access memory (RAM), a non-volatile memory such as a Flash memory, etc.), one or more storage units 56 (e.g. including a hard disk drive and/or a removable storage drive, representing a floppy disk drive, a magnetic tape drive, a compact disk drive, a flash memory device, etc.).

Computational device 53 may also include one or more communication units 57.

Such communication unit 57 may use any type of communication technology, particularly RF communication technology, particularly communication technology such as Wi-Fi, Bluetooth, ZigBee, and any remote-control communication technology as may be used by cable device 11 to communicate with any other cable device 11 or with a remote controller, a remote server, or any other computational device.

Computational device 53 may also include one or more communication buses 58 connecting the above units. Computational device 53 may also include one or more control circuitry 59 for controlling other devices coupled to, or included in, body 29.

Computational device 53 may also include one or more computer programs 60, or computer control logic algorithms, which may be stored in any of the memory units 55 and/or storage units 56. Such computer programs, when executed, enable computing system 53 to perform various functions as set forth herein. Memory units 55 and/or storage units 56 and/or any other storage are possible examples of tangible computer-readable media. Particularly, computer programs 60 may include a software program and collected data for computing the cable voltage with respect to the reference point.

Figure 6:
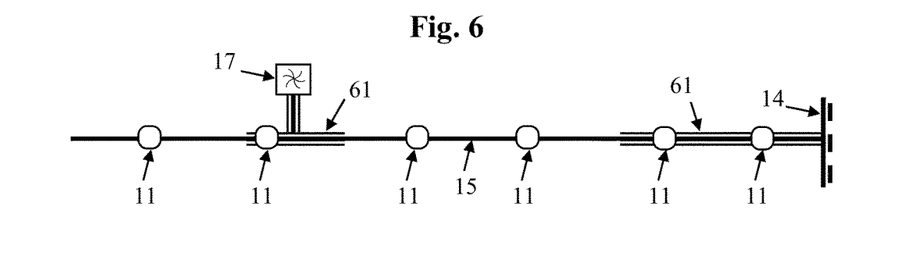
FIG. 6 is a simplified illustration of a part of an electric grid showing sensitive sections of a feed line.

Reference is now made to FIG. 6, which is a simplified illustration of a part of an electric grid showing sensitive sections 61 of a feed line 15, according to one exemplary embodiment.

As an option, the simplified illustrations of FIG. 6 may be viewed in the context of the details of the previous Figures. Of course, however, the simplified illustrations of FIG. 6 may be viewed in the context of any desired environment. Further, the aforementioned definitions may equally apply to the description below.

As may be seen in FIG. 6, feed line 15 may receive power from two sources, transformer station 14 and electric generation system 17. One sensitive segment may start at transformer station 14 and another sensitive section may start at electric generation system 17. A sensitive segment may mark the part of the feed line 15 where excessive short-circuit currents may develop. FIG. 6 is a non-limiting example of the locations of sensitive segments 61 and it is appreciated that any number of electrical sources, and any type of combination of electrical sources, is contemplated.

Short-circuit analysis system 10 may calculate the possibility of an excessive short-circuit current to develop at any particular point or section of feed line 15 by dividing the voltage provided by the close electricity source by the cable impedance from the source to the particular point. If this calculated current exceeds the planned threshold value, then the section between the electric source may develop an excessive short-circuit current. The sensitive section ends where the cumulative cable impedance increases sufficiently to decrease the possible short-circuit current below the planned threshold value.

The probability that an excessive short-circuit current may develop on the particular feed line 15 may be calculated by short-circuit analysis system 10 by dividing the cumulative length of the sensitive sections 61 by the total length of feed line 15.

Cable devices 11 may be distributed along feed line 15 to measure the actual voltage, and the actual current, at various points over feed line 15, and hence calculate the actual cable impedance of the respective sections of feed line 15. These measurements enable short-circuit analysis system 10 to calculate in real-time and accurately the length of the sensitive sections 61 and the probability of excessive short-circuit currents developing within the respective feed line.

It is appreciated that the grid is dynamic. Consumption is changing all the time, and power generation is also changing. Therefore, the network topology may be changing also, to balance between the changing consumption and changing generation. Other reasons for changing network topology are other operational considerations such as reliability considerations and maintenance activities.

Changing topology may cause real-time changing of the impedance of various segments or sections of the grid. by using the distributed plurality of cable devices 11, and particularly the accurate real-time measurements of voltage and current by the cable devices 11, short-circuit analysis system 10 may accurately calculate the actual real-time impedance of each sensitive section 61, and even parts thereof. In this respect, short-circuit analysis system 10 may analyze any part of the distribution grid 12 as a dynamic real-time system.

Short-circuit analysis system 10 may then present to a user, for example in a graphical manner, the actual sensitive sections of the electric grid, as well as the excessive current probability value for any part of the grid. Therefore providing calculation of the dynamic behavior of possible development of excessive short-circuit currents in the electric grid.

Even further, short-circuit analysis system 10 may enable a user to virtually change the power distribution between the various electricity sources of each part of the electric grid and view the resulting distribution of sensitive segments and the excessive current probability value. Thus, short-circuit analysis system 10 may also provide predictive analysis of the dynamics of developing an excessive short-circuit currents.

Hence, by selecting an optimal distribution of power generation between the various sources of electricity, a user may reduce the overall probability of excessive short-circuit current within the respective feed line. Alternatively, a user may reduce the probability of excessive short-circuit current within a critical section of the grid for example, by increasing the probability in less critical parts of the feed line.

It is appreciated that the discussion herein is not limited to a single-phase short circuit, and that dual-phase short circuit, or three-phase short circuit, are also contemplated. The term "single-phase short circuit" may refer to a short-circuit between any one phase carrying cable and neutral (zero) or ground reference. The terms "two-phase short circuit" and "three-phase short circuit" may refer to a short-circuit between any two or three phase carrying cables.

It is appreciated that the plurality of cable devices 11 distributed along the distribution grid 12, and particularly along the sensitive sections 61, enables detailed and accurate measurements of voltage and current as well as the phase-difference between the voltage and current along distribution grid 12 for each phase of distribution grid 12. The term "phase-difference" may refer to the time difference between the syne wave signals of the voltage and the current, usually measured in degrees or radians of the syne wave.

Hence, short-circuit analysis system 10 may calculate detailed and accurate multiphase impedance along the distribution grid 12 for various combinations of phases. Thus, short-circuit analysis system 10 may dynamically calculate the sensitive sections 61 for each type of short-circuit (single-phase through the zero line, single-phase through ground, dual-phase, three-phase, etc.). short-circuit analysis system 10 may then dynamically calculate the probability for any type of short-circuit event for any part of distribution grid 12, and present the calculated data to a user.

Figure 7:
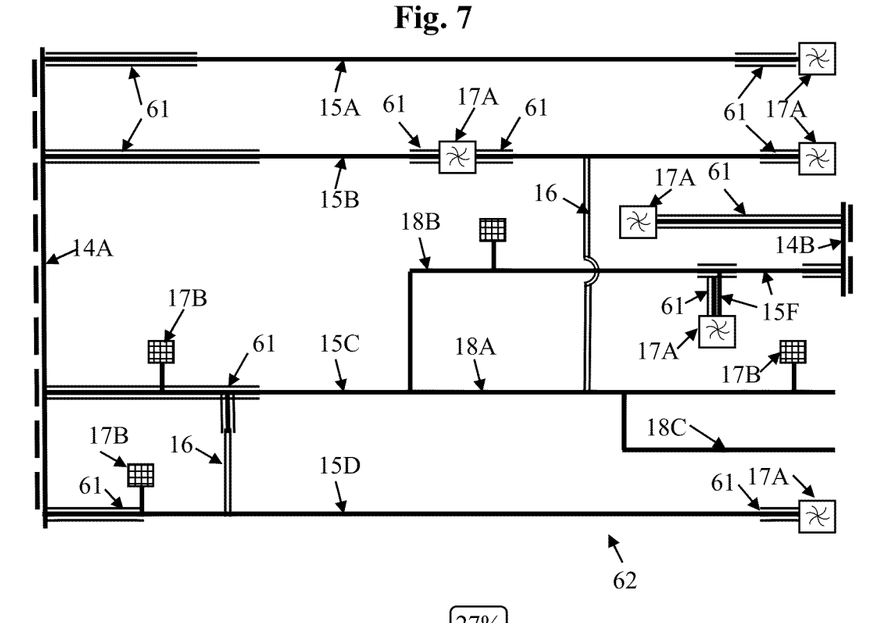
FIG. 7 is a simplified illustration of an example of a topological map display as may be provided to a user.
Figure 8:
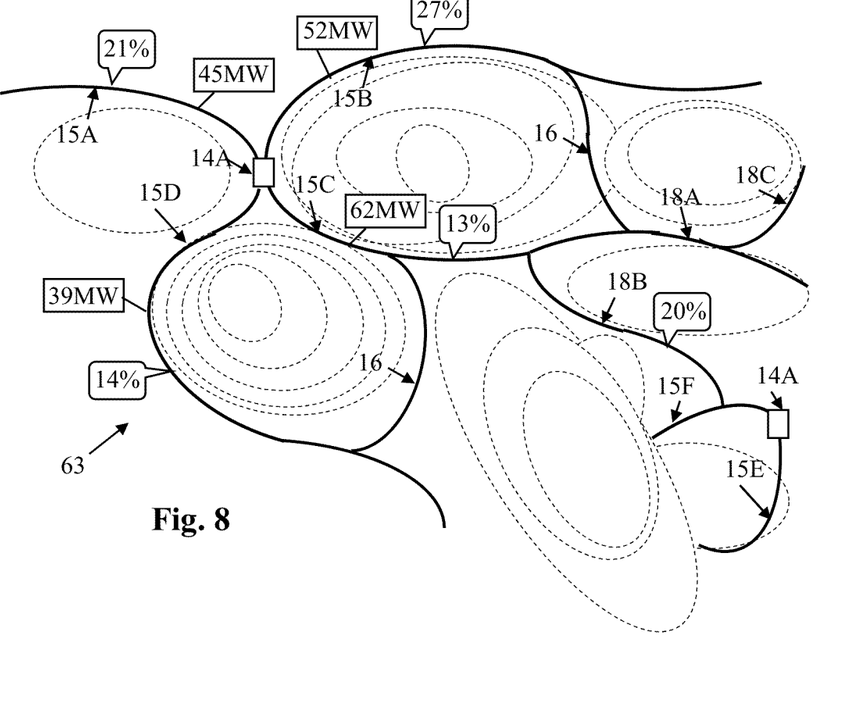
FIG. 8 is a simplified illustration of an example of a geographical map display 1 as may be provided to a user.

Reference is now made to FIG. 7, which is a simplified illustration of an example of a topological map display 62 as may be provided to a user, and to FIG. 8, which is a simplified illustration of an example of a geographical map display 63 as may be provided to a user, according to one exemplary embodiment.

As an option, the simplified illustrations of FIG. 7 and FIG. 8 may be viewed in the context of the details of the previous Figures. Of course, however, the simplified illustrations of FIG. 7 and FIG. 8 may be viewed in the context of any desired environment. Further, the aforementioned definitions may equally apply to the description below.

As a non-limiting example, FIG. 7 and FIG. 8 may be respective representations of the distribution grid 12 of FIG. 1, which may be regarded as a schematic map of distribution grid 12. It is appreciated that the user may select to view either the topological map display 62, or the geographical map display 63, or both (as well as the schematic map of FIG. 1). The two (or more) map displays may be provided on two different screens or on two parts of the same screen. Other types of maps (such as the schematic map of FIG. 1) are also contemplated.

As a non-limiting example, the user has selected for FIG. 7 to view various values such as the length of the sensitive sections of various feed lines in a graphical manner. Namely, in map 62 the length of the sensitive sections is shown graphically. As another non-limiting example, the user has selected for FIG. 8 to view various values such as the power provisioning, and the probability of excessive short-circuit current events, for various feed lines, in a numerical manner. Namely, in map 63 the power and provability values appear beside the respective feed lines. It is appreciated that the user may select to view any measured and/or calculated parameter in any manner such as numerically and/or graphically (including various colors, etc.)

Figure 9A:
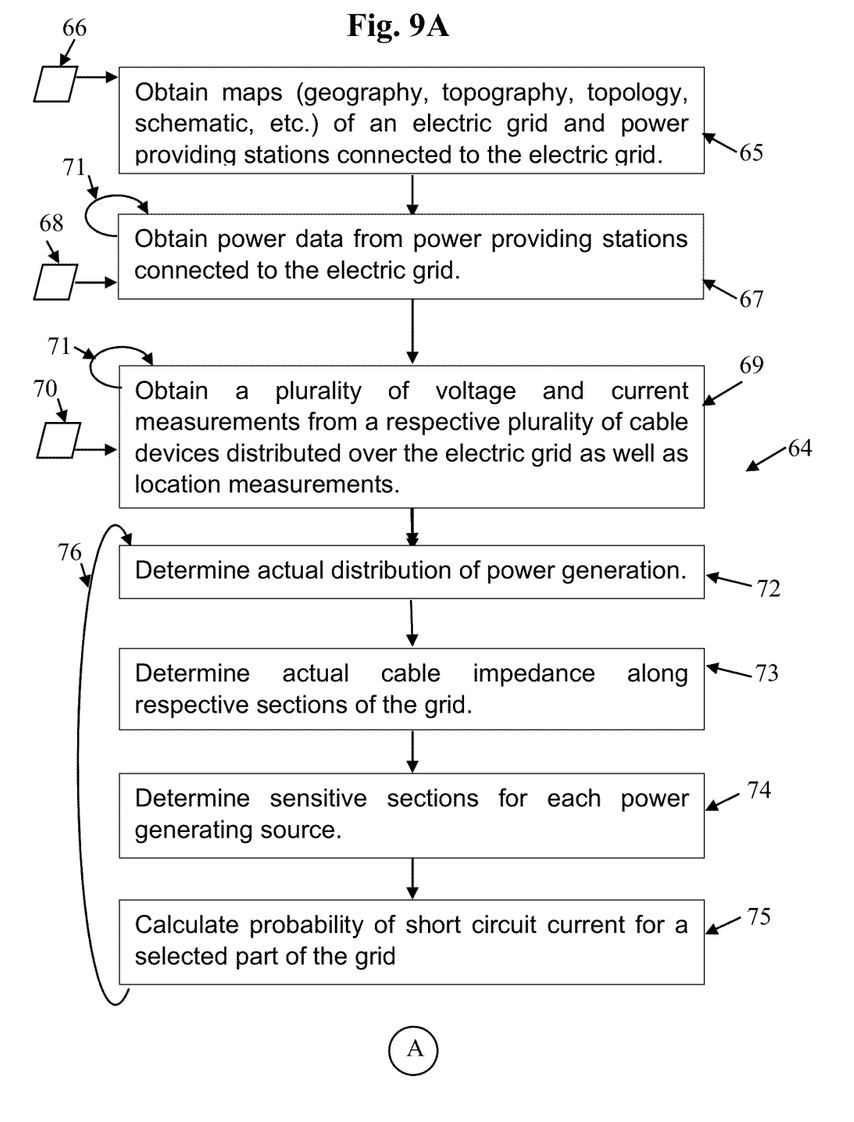
FIG. 9A and FIG. 9B taken together are a simplified flow chart of a basic computing process executed by a short-circuit analysis system.
Figure 9B:
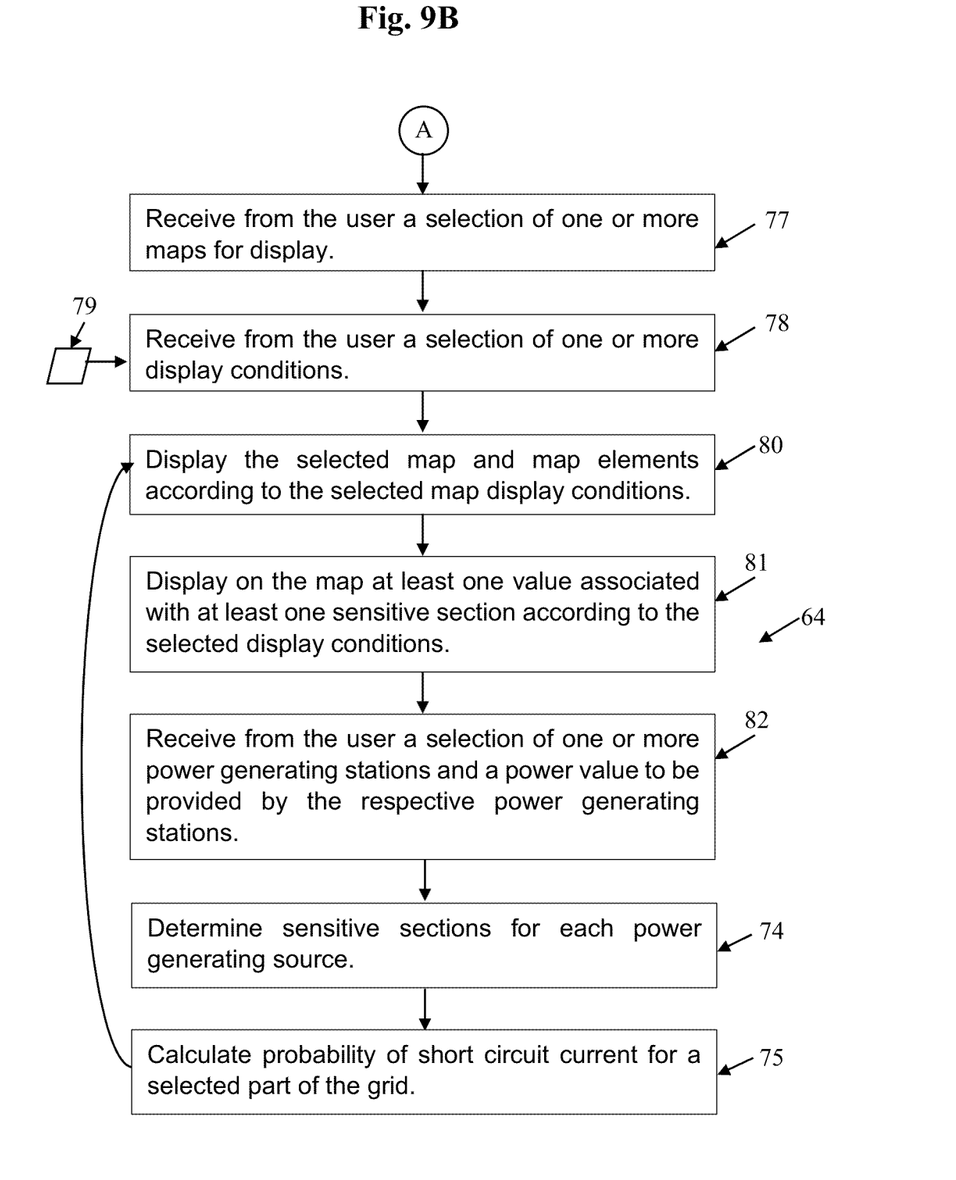

Reference is now made to FIG. 9A, and FIG. 9B, which, taken together, are a simplified flow chart of a basic computing process 64 executed, for example, by short-circuit analysis system 10, according to one exemplary embodiment.

As an option, the simplified flow chart of FIG. 9A, and/or FIG. 9B, may be viewed in the context of the details of the previous Figures. Of course, however, the simplified flow chart of FIG. 9A, and FIG. 9B, may be viewed in the context of any desired environment. Further, the aforementioned definitions may equally apply to the description below.

It is appreciated that some of the actions of basic computing process 64 may be executed by grid management system 20. It is appreciated that the flow chart of basic computing process 64 may be embodied as one or more computer programs executed by one or more processors of short-circuit analysis system 10 and/or grid management system 20. It is appreciated that basic computing process 64 may collect data from any of short-circuit analysis system 10 and/or grid management system 20. Such data may be collected from a user of the respective system.

Basic computing process 64 may start with action 65 by obtaining various maps 66. Maps 66 may include a geographic map for the area of grid 12, a topographic map for the area of grid 12, a topologic map of grid 12, an electric schematic of grid 12, etc.

Basic computing process 64 may proceed to action 67 to obtain power data 68 from power providing stations connected to the electric grid.

Basic computing process 64 may proceed to action 69 to obtain a plurality of voltage and current measurements 70 from a respective plurality of cable devices 11 distributed over the electric grid 12, as well as location measurements of the respective cable devices 11.

The term 'obtain' herein may also refer to actions such as 'obtaining access to', and/or 'obtaining data', and/or 'obtaining a database of', etc. Therefore, actions 67 and/or 69 may be performed continuously, or repeatedly, to update the collection of faults 70 as may be indicated by curled arrows 71.

Basic computing process 64 may proceed to action 72 to determine the actual distribution of power generation in grid 12. In other words, action 72 determines which power source is actually providing electricity to grid 12 and how much. Basic computing process 64 may then proceed to action 73 to determine actual cable impedance along respective sections of the grid, for example, between each two succeeding cable devices 11.

Basic computing process 64 may proceed to action 74 to determine and/or calculate the sensitive sections 61 of grid 12. A sensitive sections 61 represents the length of cable 21 of a particular feed line 15 of grid 12 that may be susceptible to developing excessive short circuit current. An excessive short circuit current may be higher than a threshold value for the particular feed line 15 of grid 12. The sensitive sections 61 may be calculated by summing the impedance along cable 21 so that the resulting short circuit current may be lower than the respective threshold value. The sensitive sections 61 may be calculated from the proximal (closest) operative power generating source. The length of cable 21 from the proximal operative power generating source is considered sensitive section until the cumulative impedance may cause a short circuit at the end (remote, distal) point of the sensitive section to produce short-circuit current that is just below the respective threshold value.

Basic computing process 64 may proceed to action 75 to determine and/or calculate the probability of occurrence of events of excessive short-circuit current in the grid 12, or a part of grid 12, as may be determined by the user of basic computing process 64. The probability may be calculated by dividing the cumulative length of the sensitive sections in the selected part of grid 12 by the total length of the cables of the selected part of grid 12.

It is appreciated that any of actions 72 to 75 may be performed continuously, or repeatedly, to update the calculated values, as may be indicated by curled arrow 76.

Basic computing process 64 may proceed to action 77 to receive from a user a selection of a map to be displayed. Basic computing process 64 may then proceed to action 78 to obtain a list of display conditions 79. As a non-limiting example, the list of display conditions 79 may be obtained from a user of grid management system 20.

The user may create a list of display conditions 79 and/or select a list of display conditions 79, and/or update a list of display conditions 79. The display conditions 79 may include one or more map display conditions, and/or grid display conditions, and/or one or more graphical display conditions, and/or one or more numerical display conditions, etc. typically associated with values such as power, voltage, current, length of sensitive sections, probability of excessive short-circuit current, etc.

In this respect, map display conditions may include a type of the map to be used (e.g., geographic, topographic, topologic, schematic, etc.), the required area or part of the grid. Grid display conditions may include grid elements such as consumers, electricity providing stations, monitoring stations, etc. The term 'electricity providing station' may include a transformer station, an electricity generation system (e.g., a gas turbine 17A, a wind turbine 17A, a photovoltaic system 17B), an electricity storage system (not shown), etc. The term 'monitoring stations' may include cable devices 11.

Basic computing process 64 may proceed to action 80 to display the selected map and map features and elements according to the selected map display conditions, etc., and to action 81 to display the selected values according to their selected display conditions. The result may look like the maps of any of FIG. 7 and FIG. 8.

It is therefore appreciated that basic computing process 64, when executed by a processor of, for example, short-circuit analysis system 10, may present to a user a visual illustration of a selected history of short-circuit faults (events) in electric grid 12. The method, as illustrated by computing process 64, may obtain a collection of short-circuit faults in the electric grid, obtain a list of a plurality of display conditions, receive from the user a selection of at least one of the display conditions, and display to the user, on a map, the short-circuit faults to which the selected display conditions apply.

The map may be a geographical map or a topology map as selected by the user. Basic computing process 64 may also receive from the user a selection of one or more features of the geographical map. Basic computing process 64 may then select faults that are associated with the selected features, and display the selected faults on the selected map. The features of the geographical map may include one or more valleys, ridge, peak, slope, height, plane, and region. Similarly, basic computing process 64 may use a selection of features of the topological map.

The method, as illustrated by basic computing process 64, may also receive from the user a selection of a weather condition; and then select faults that are associated with the selected weather condition. Such weather conditions may include, for example, temperature, humidity, wind speed, wind direction, precipitation, rain, snow. Such weather conditions may be described by a value or a range of values.

Basic computing process 64 may also display on the relevant map an icon representing a fault such as a short-circuit event. Each icon type may be associated with a different short-term fault. An icon may be selected according to the display condition that applies to the short-term fault, a type of the short-term fault; and time lapsing from a previous related fault.

Basic computing process 64 may also receive from the user a selection of a time-step value; and then display on the map the short-circuit faults to which the selected display conditions apply in an animated time-stepped manner.

Basic computing process 64 may then proceed to action 82 to receive from a user a selection of one or more power generating stations and a power value to be provided by the respective power generating stations. This may virtually alter the power values and consequently the lengths of the sensitive sections (action 74 of FIG. 9B). and the associated probability of short circuit current for a selected part of the grid (action 75 of FIG. 9B). Basic computing process 64 may then return to action 80 to update the displayed maps accordingly.

It is therefore appreciated that short-circuit analysis system 10 may predict short circuit events in electric grid 12 by communicating with a plurality of cable mounted sensors distributed on each phase carrying cable of the electric grid. These cable mounted sensors may measure instantaneous voltage and/or instantaneous current and thus determine electricity generation sources feeding the electric grid as well as the actual voltage output of each electricity generation source. Thereafter, the short-circuit analysis system 10 may determine the cable length from each electricity generation source where a short-circuit current may be higher than the permitted (threshold) short circuit current.

Hence the short-circuit analysis system 10 may provide a user visual information of the cable length subject to excessive short-circuit current (the sensitive section). The visual information provided to the user may include a geographical map of the electric grid, and/or a topological map of the electric grid. The short-circuit analysis system 10 may also calculate the and provide to the user probability of an excessive short circuit event.

The short-circuit analysis system 10 may calculate the probability of excessive short circuit events according to the ratio between the total (cumulative) length of the cable where short-circuit current may be higher than permitted, and the total length of grid cables. For displaying the information to the user, short-circuit analysis system 10 may receive from the user a selection of a part of the electric grid, and calculate the probability of an excessive short circuit event within the selected part of the electric grid.

The short-circuit analysis system 10 may also measure, by at least one of the cable mounted sensors, one or more parameters such as: temperature, humidity, wind speed and direction, precipitation rate and type, cable temperature, and temperature of at least one of the electricity generation sources, and determine the cable length from each electricity generation source where short-circuit current may be higher than permitted short circuit current according to the measured parameters.

It is appreciated that certain features, which are, for clarity, described in the context of separate embodiments, may also be provided in combination in a single embodiment. Conversely, various features, which are, for brevity, described in the context of a single embodiment, may also be provided separately or in any suitable sub-combination.

Although descriptions have been provided above in conjunction with specific embodiments of the invention, it is evident that many alternatives, modifications, and variations will be apparent to those skilled in the art. Accordingly, it is intended to embrace all such alternatives, modifications and variations that fall within the spirit and scope of the invention. All publications, patents and patent applications mentioned in this specification are herein incorporated in their entirety by reference into the specification, to the same extent as if each individual publication, patent, or patent application was specifically and individually indicated to be incorporated herein by reference. In addition, citation, or identification of any reference in this application shall not be construed as an admission that such reference is available as prior art.

What is claimed is:

1. A computer-implemented method for predicting short circuit events in an electric grid, the method comprising:
   distributing a plurality of cable mounted sensors on each phase carrying cable of the electric grid;
   measuring at least one of instantaneous voltage and instantaneous current by each of the plurality of cable mounted sensors;
   determining electricity generation sources feeding the electric grid;
   determining voltage output for each electricity generation source feeding the electric grid;
   determining cable length from each electricity generation source where short-circuit current may be higher than permitted short circuit current; and
   calculating probability of an excessive short circuit event.

2. The method according to claim 1, additionally comprising:
   providing a user visual information of the cable length subject to excessive short circuit current.

3. The method according to claim 2, wherein the visual information provided to the user comprises at least one of:
   a geographical map of the electric grid; and
   a topological map of the electric grid.

4. The method according to claim 1, additionally comprising:
   calculating the probability of excessive short circuit events according to ratio between total length of cable where short-circuit current may be higher than permitted short circuit current and total length of grid cables.

5. The method according to claim 1, additionally comprising:
   receiving from a user a selection of a part of the electric grid; and
   calculating the probability of an excessive short circuit event within the selected part of the electric grid.

6. The method according to claim 1, additionally comprising:
   measuring, by at least one of the cable mounted sensors, at least one of: cable temperature, and temperature of at least one of the electricity generation sources; and
   determining the cable length from each electricity generation source where short circuit current may be higher than permitted short circuit current according to the at least one temperature measurements.

7. A computer program product embodied on a non-transitory computer readable medium, including instructions that, when executed by at least one processor, cause the at least one processor to perform operations comprising:
   measuring at least one of instantaneous voltage and instantaneous current by each of a plurality of cable mounted sensors distributed on each phase carrying cable of an electric grid;
   determining electricity generation sources feeding the electric grid;
   determining voltage output for each electricity generation source feeding the electric grid;
   determining cable length from each electricity generation source where short-circuit current may be higher than permitted short circuit current; and
   calculating probability of an excessive short circuit event.

8. The computer program product according to claim 7, additionally comprising:
   providing a user visual information of the cable length subject to excessive short-circuit current.

9. The computer program product according to claim 8, wherein the visual information provided to the user comprises at least one of:
   a geographical map of the electric grid; and
   a topological map of the electric grid.

10. The computer program product according to claim 7, additionally comprising:
    calculating the probability of excessive short circuit events according to ratio between total length of cable where short-circuit current may be higher than permitted short circuit current and total length of grid cables.

11. The computer program product according to claim 7, additionally comprising:
    receiving from a user a selection of a part of the electric grid; and
    calculating the probability of an excessive short circuit event within the selected part of the electric grid.

12. The computer program product according to claim 7, additionally comprising:
    measuring, by at least one of the cable mounted sensors, at least one of: cable temperature, and temperature of at least one of the electricity generation sources; and
    determining the cable length from each electricity generation source where short-circuit current may be higher than permitted short circuit current according to the at least one temperature measurements.

13. A computational system for predicting short circuit events in an electric grid, the system comprising a processor and memory capable of:
    measuring at least one of instantaneous voltage and instantaneous current by each of a plurality of cable mounted sensors distributed over electric cables of an electric grid;
    determining electricity generation sources feeding the electric grid;
    determining voltage output for each electricity generation source feeding the electric grid;
    determining cable length from each electricity generation source where short-circuit current may be higher than permitted short circuit current; and
    calculating probability of an excessive short circuit event.

14. The system according to claim 13, additionally comprising:
    providing a user visual information of the cable length subject to excessive short-circuit current.

15. The system according to claim 14, wherein the visual information provided to the user comprises at least one of:
    a geographical map of the electric grid; and
    a topological map of the electric grid.

16. The system according to claim 15, additionally comprising:
    calculating the probability of excessive short circuit events according to ratio between total length of cable where short-circuit current may be higher than permitted short circuit current and total length of grid cables.

17. The system according to claim 13, additionally comprising:
    receiving from a user a selection of a part of the electric grid; and
    calculating the probability of an excessive short circuit event within the selected part of the electric grid.

18. The system according to claim 13, additionally comprising:
    measuring, by at least one of the cable mounted sensors, at least one of: cable temperature, and temperature of at least one of the electricity generation sources; and
    determining the cable length from each electricity generation source where short-circuit current may be higher than permitted short circuit current according to the at least one temperature measurements.

* * * * *